(12) United States Patent
Fitz et al.

(10) Patent No.: US 6,835,581 B2
(45) Date of Patent: Dec. 28, 2004

(54) METHOD OF COATING OPTICAL DEVICE FACETS WITH DIELECTRIC LAYER AND DEVICE MADE THEREFROM

(75) Inventors: John L. Fitz, Baltimore, MD (US); Daniel Stephen Hinkel, Laurel, MD (US); Scott C. Horst, Sykesville, MD (US); Harris Turk, Baltimore, MD (US)

(73) Assignee: The United States of America as represented by the National Security, Washington, DC (US)

( * ) Notice: Subject to any disclaimer, the term of this patent is extended or adjusted under 35 U.S.C. 154(b) by 362 days.

(21) Appl. No.: 09/933,476

(22) Filed: Aug. 17, 2001

(65) Prior Publication Data

US 2003/0035453 A1 Feb. 20, 2003

(51) Int. Cl.$^7$ .............................. H01L 21/00; H01S 5/00
(52) U.S. Cl. ............................................ 438/22; 372/49
(58) Field of Search .................. 372/43–50; 438/22–39, 438/42, 43, 44; 257/433–437

(56) References Cited

U.S. PATENT DOCUMENTS 6,289,030 B1 * 9/2001 Charles ....................... 372/49

OTHER PUBLICATIONS

Chia–Chen Lin et al., "Facet–Coating Effects on the 1.3$\mu$m Strained Multiple Quantum Well AlGaInAs/InP Laser Diodes", JJAP, vol. 37 pp 6399–6402, Dec. 1998.

H. Temkin et al., "InGaAs/InP Quantum Well Lasers with Sub–mA Threshold Current", APL vol. 57 No. 16 Oct. 15, 1990.

Y. Yuan et al., "Edge–Emitting Lasers with Short–Period Semiconductor/ Air Distributed Bragg Reflector Mirrors", IEEE PTL, vol. 9 No. 7, 7/97 pp 881–883.

E. Hofling et al., "Edge–Emitting GaInAs–AlGaAs Microlasers" IEEE PTL, vol. 11, No. 8, pp. 943–945 Aug. 1999.

Mothi Madhan et al., "Continous Wave Operation of 1.55$\mu$m GaInAsP/InP Laser with Semiconductor/Benzocyclobutene Distributed Bragg Reflector" JJAP vol. 38 pp L1240–L1242 Nov. 1, 1999.

* cited by examiner

Primary Examiner—Quyen Leung
(74) Attorney, Agent, or Firm—Robert D. Morelli

(57) ABSTRACT

A method of simultaneously depositing dielectric layers on both facets of an optical device and devices made therefrom. The steps of the method are selecting a substrate; forming an optical device on the substrate; forming an active-layer pumping structure on the optical device; forming facets in the optical device with at least two different orientations; and coating a user-definable number of dielectric layers onto the facets. The dielectric layers may be deposited in single dielectric layers or in pairs of dielectric layers. Single layers are useful for forming optical amplifiers while dielectric pairs are useful for forming lasers.

9 Claims, 3 Drawing Sheets

METHOD OF COATING OPTICAL DEVICE FACETS WITH DIELECTRIC LAYER AND DEVICE MADE THEREFROM

FIELD OF THE INVENTION

The present invention relates, in general, to semiconductor device manufacturing process and, in particular, to coating of substrate containing semiconductor region or of semiconductor substrate.

BACKGROUND OF THE INVENTION

Light is produced by the transition of electrons from higher energy states to lower energy states. The law of conservation of energy is satisfied in these transition processes by the emission of a photon, or quantum of light, whose energy corresponds to the difference in energy of the initial and final energy states of the electron. In nature, photons are created spontaneously at many different frequencies. In Light Amplification by Stimulated Emission of Radiation (laser), a light wave having a wavelength that corresponds to the difference between a high energy state and a low energy state that strikes an electron in the high energy state will cause the electron to transition to the low energy state and emit a photon with the same direction, phase, polarization, and frequency as the incident photon of the light wave. Thus, a traveling light wave of a certain frequency is produced.

A semiconductor ridge laser is useful as an element in a photonic integrated circuit because it emits light horizontally which can be processed by another element which is formed on the horizontal plane of the substrate of the photonic integrated circuit. A ridge laser that includes an active layer in which a traveling light wave is stimulated has been produced by many different means.

A dielectric layer is formed on each end, or facet, of an optical device to increase or decrease the reflectance of each facet. Typically, the facets are cleaved. The reflectance of a facet without a dielectric layer deposited thereon is a function of the difference in refractive index of the optical device material and the transmission medium (e.g., air). The reflectance of a facet with a dielectric layer deposited thereon is a function of the difference in refractive indexes of the optical device material, the dielectric layer material, the transmission medium, and the thickness of the dielectric layer.

A dielectric layer may be deposited onto a facet (i.e., a coated facet) to either increase or decrease the reflectance of the facet coated with a dielectric layer as compared to the facet without a dielectric layer deposited thereon (i.e., an uncoated facet). Increasing facet reflectance is one method of reducing the minimum cavity length at which a semiconductor laser will operate. Minimizing the cavity length of a semiconductor laser allows for increased packing density, increased operating speed, lowered operating current, and reduced power consumption. Decreasing facet reflectance prevents lasing of an optical device and allows the resulting device to operate as an optical amplifier.

To reduce the cavity length of a semiconductor laser, facet reflectance must be increased. To increase the reflectance of a facet, at least one pair of dielectric layers must be deposited on the facet, where the optical thickness of each dielectric layer within the pair is an odd integer multiple of quarter wavelengths, and where the first dielectric layer in a pair has a lower index of refraction than the second dielectric layer in the pair. The optimal thickness is $t=m\lambda/n4$, where m is an odd integer, where $\lambda$ is the free-space emission wavelength of the laser, and where n is the refractive index of the dielectric layer.

To form an optical amplifier, facet reflectance must be reduced to prevent lasing. To decrease the reflectance of a facet, at least one single dielectric layer must be deposited on the facet, where the optical thickness of the dielectric layer is an odd integer multiple of quarter wavelengths. The optimal thickness is $t=m\lambda/n4$, where m is an odd integer, where $\lambda$ is the free-space emission wavelength of the optical amplifier, and where n is the refractive index of the dielectric layer. The optimal refractive index of the dielectric layer is equal to the square root of the refractive index of the optical device for minimal reflectance.

One prior art method of increasing or decreasing facet reflectance is by thermally evaporating a dielectric material in one direction (e.g., up) onto the facet. With such a method, thermal evaporation must be done a first time at a first orientation of an optical device and then a second time at a second orientation (i.e., rotated 180 degrees). Since unidirectional thermal evaporation is slow and requires precise physical manipulation of the device, it is not a suitable process for a conventional microelectronics process in which a substantial number of devices are manufactured at the same time. Unidirectional thermal evaporation is mentioned in a first article entitled "Facet-Coating Effects on the 1.3 µm Strained Multiple-Quantum-Well AlGaInAs/InP Laser Diodes," by Chia-Chien Lin et al., published in the *Japanese Journal of Applied Physics*, Vol. 37 (1998), pp. 6399–6402 and in a second article entitled "InGaAs/InP quantum well lasers with sub-mA threshold current," by H. Temkin et al., published in the *Applied Physics Letters*, Vol. 57, No. 16, Oct. 15, 1990.

Another method of increasing or decreasing facet reflectance is by etching at least one air gap in a semiconductor material near the facet. The air gap may be filled with a dielectric material to reduce diffraction losses. Etching and filling air gaps are additional steps that take time and are prone to error.

A semiconductor Bragg reflector composed of air gaps and semiconductor layers may be etched to increase or decrease the reflectance of a facet. Etching a Bragg reflector requires an electron-beam (i.e., e-beam) lithography machine that is expensive and slow. E-beam machines have sufficient resolution to define etched layers to form a high order Bragg reflector, but do not have sufficient resolution to define etched layers required to form a first order Bragg reflector and, therefore, cannot maximize optical reflection efficiency. An E-beam process is disclosed in a first article entitled "Edge-Emitting Lasers with Short-Period Semiconductor/Air Distributed Bragg Reflector Mirrors," by Y. Yuan et al., published in the *IEEE Photonics Thechnology Letters*, Vol. 9, No. 7, pp. 881–883, July 1997, a second article entitled "Edge-Emitting GaInAs-AlGaAs Microlasers," by E. Hofling et al., published in *IEEE Photonics Technology Letters*, Vol. 11, No. 8, pp. 943–945, August 1999, and a third article entitled "Continuous Wave Operation of 1.55 µm GaInAsP/InP Laser with Semiconductor/Benzocyclobutene Distributed Bragg Reflector," by Mothi Madhan et al., published in the *Japanese Journal of Applied Physics*, Vol. 38, pp. L1240–L1242, Nov. 1, 1999. The third article provides details on filling air gaps with a dielectric.

A vertical cavity surface emitting laser (VCSEL) is a laser in which mirrors are formed by depositing epitaxial layers. Epitaxial layer deposition is a method that is compatible with microelectronics fabrication techniques, but a VCSEL emits light vertically and, therefore, is not useful as an element in a photonic integrated circuit which requires horizontal light emission.

SUMMARY OF THE INVENTION

It is an object of the present invention to fabricate an optical device in which light travels horizontal to a substrate on which the optical device is formed so that the optical device is useful as an element in a photonic integrated circuit.

It is another object of the present invention to modify the reflectance of facets of an optical device in a conformal coating manner that is compatible with conventional microelectronics processes.

The present invention is a method of simultaneously depositing dielectric material onto multiple facets of an optical device, where the facets are in multiple orientations, to change the reflectance of the facets using a conformal coating process.

The first step of the method is selecting a substrate that supports optical activity.

The second step of the method is forming an optical device on the substrate.

The third step of the method is forming at least one active-layer pump structure for operating the optical device.

The fourth step of the method is forming a facet on each end of the optical device.

The fifth step of the method is simultaneously coating a user-definable number of dielectric layers on the facets of the optical device, where the facets have at least two different orientations.

Various devices such as a laser and an optical amplifier may be made using the method of the present invention.

DETAILED DESCRIPTION

The present invention is a method of depositing at least one dielectric layer simultaneously on facets of an optical device in which light travels horizontally, such as a ridge laser and an optical amplifier.

Figure 1:
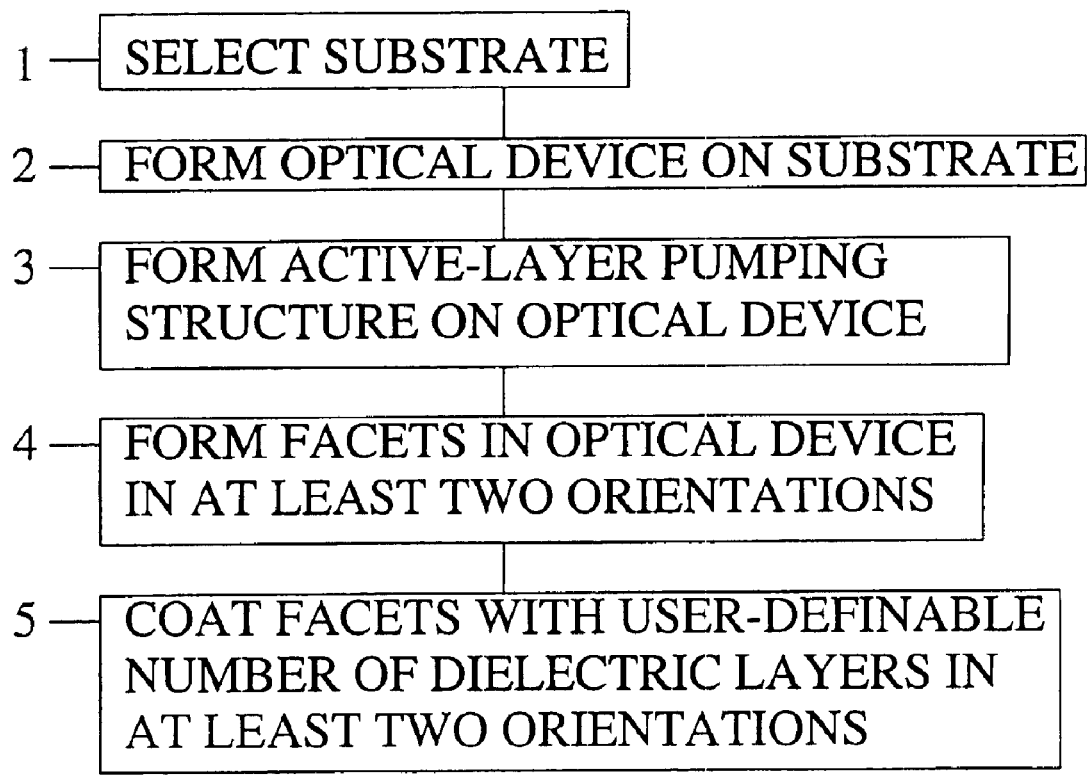
FIG. 1 is a list of the steps of the present invention.

FIG. 1 is a list of the steps of the present invention. The first step 1 of the method is selecting a substrate that supports optical activity. In the preferred embodiment, the substrate is selected from the group of substrates consisting of sapphire, GaAs, GaSb, InAs, InP, InSb, quartz, or any other suitable material. The substrate may be undoped, doped, doped n+, doped p+, or semi-insulating.

The second step 2 of the method is forming an optical device on the substrate, where the optical device includes at least one active layer in which photon emission may be stimulated. The optical device may be formed by any suitable method. The optical device formed on the substrate may include a PN junction of direct gap semiconductors, a PIN structure with direct gap semiconductor quantum wells, a graded index structure with direct gap semiconductor quantum wells, Er doped glass layers, or any other suitable structure. The optical device may be in the form of a ridge, a buried heterostructure, a polygonal mesa, a ring, a Y-structure, or any other suitable form.

The third step 3 of the method is forming at least one active-layer pump structure for operating the optical device. The active-layer pump structure may be a contact on the optical device, an optical-pump window on the optical device, or any other suitable structure for operating the optical device.

The fourth step 4 of the method is forming facets on the optical device, where the facets are in at least two different orientations. If device operation requires it, each facet may extend through the optical device and into the substrate to a user-definable depth. The facets may be formed by an etching method such as Inductively Coupled Plasma (ICP), Reactive Ion Etching (RIE), Chemically Assisted Ion Beam Etching (CAIBE), anisotropic wet etching, or any other suitable etching method. In the preferred embodiment, the facets are etched using ICP.

The fifth step 5 of the method is simultaneously coating a user-definable number of dielectric layers onto the facets of the optical device, where the facets are at more than one orientation. The facets may be coated using Plasma Enhanced Chemical Vapor Deposition (PECVD), plasma assisted sputtering, or any other suitable method. In the preferred embodiment, PECVD is used to conformally coat the facets.

For a laser, dielectric layers are deposited in pairs to increase facet reflectance, where the first dielectric layer in a pair has a lower index of refraction than the second dielectric layer in the pair, and where the optical thickness of each dielectric layer in a pair is an odd integer multiple of quarter wavelengths. The optimal thickness of a dielectric layer is $t=m\lambda/n4$, where m is an odd integer, where $\lambda$ is the free-space emission wavelength of the laser, and where n is the refractive index of the dielectric layer.

The first dielectric layer in a pair of dielectric layers is conformally deposited onto either the bare facets of the laser or the second dielectric layers of a previous pair of dielectric layers. The second dielectric layer in a pair of dielectric layers is conformally coated over the first dielectric layer in the pair. Each pair of dielectric layers deposited on a facet acts as a dielectric mirror which increases the amount of light reflected back into the laser and, therefore, reduces the threshold current for lasing for a given laser cavity length. For a given reflectance, decreasing the laser cavity length increases the laser threshold current. Therefore, depositing dielectric mirrors in the form of conformally coated pairs of dielectric layers is a method of realizing the shortest laser cavity possible for a desired threshold current and compensating for an increase in laser threshold current with decreasing cavity length. To a point, the shorter the desired laser cavity length the greater the number of pairs of dielectric layers that must be deposited.

For an optical amplifier, at least one single dielectric layer is deposited. If one dielectric layer is deposited, the optical thickness of the layer is an odd integer multiple of quarter wavelengths. The optimal thickness of the dielectric layer is $t=m\lambda/n4$, where m is an integer, where $\lambda$ is the free-space emission wavelength of the optical amplifier, and where n is the refractive index of the dielectric layer. The refractive index of the dielectric layer must be lower than that of the optical amplifier. Optimally, the refractive index of the dielectric layer is equal to the square root of the refractive index of the optical amplifier.

Figure 2:
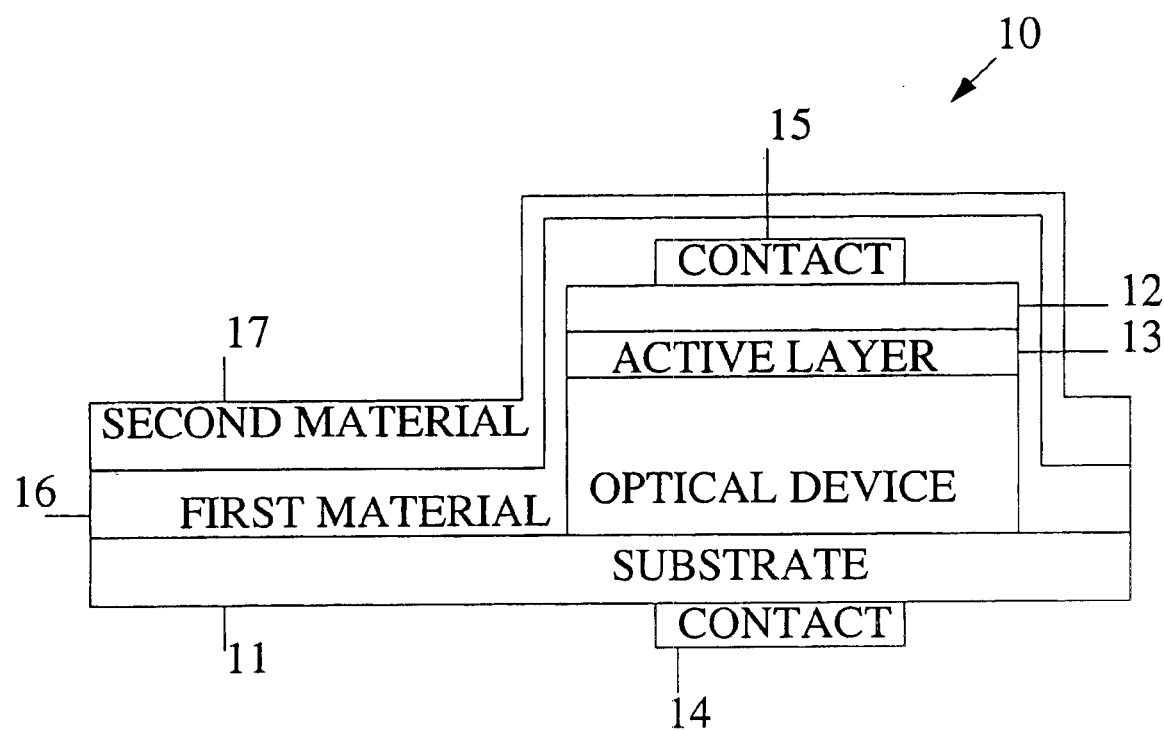
FIG. 2 is a cross-section view of a laser embodiment of the present invention.

FIG. 2 is a cross-sectional view of a laser 10 made by the method of the present invention. The laser 10 includes a substrate 11 of a material that is selected from the group of substrate materials that supports optical activity. In the preferred embodiment, the group of substrate materials consists of sapphire, GaAs, GaSb, InSb, InAs, InP, InSb, and quartz. The substrate may be undoped, doped, doped n+, doped p+, or semi-insulating.

An optical device 12 is formed on the substrate 11, where the optical device 12 includes an active layer 13 in which light emission is stimulated. The optical device 12 may be formed by any suitable method. The optical device 12 may be a PN junction of direct gap semiconductors, a PIN structure with direct gap semiconductor quantum wells, a graded index structure with direct gap semiconductor quantum wells, Er doped glass layers, or any other suitable laser structure. The optical device 12 may be of any suitable structure (e.g., ridge, buried heterostructure, polygonal mesa, ring, Y-junction, etc.). In the preferred embodiment, the laser 10 is a GaAs/AlGaAs ridge laser with a graded index separate confinement heterostructure (GRIN-SCH) double quantum well grown by MOCVD.

A backside contact 14 is formed on the bottom-side of the substrate 11 to pump the active layer of the optical device 12. In the preferred laser embodiment, the backside contact 14 is an n-type ohmic metal such as NiAuGeNiAu, but any other suitable contacting method may be used, including contacting methods where the contacts are all made from one side of the optical device 12. In an alternate embodiment, optical pumping may also be used to pump the active layer of the optical device 12.

A top-side contact 15 is formed on the optical device 12. In the preferred embodiment, the top-side contact 15 is TiPtAu metal, but any other suitable contacting method may be used. The top-side contact 15 may extend past the boundary of the optical device 12 to more easily access the top-side contact 15 from a subsequent layer. A via (not shown) must be etched in subsequent layers deposited over the top-side contact 15 in order to access the top-side contact 15. Facets are then formed into each end of the optical device 12 to a user-definable depth into the substrate 11. The facets may be formed by ICP, RIE, CAIBE, anisotropic wet etching, or any other suitable method. The process of etching facets rather than cleaving facets as in the prior art is more compatible with microelectronics fabrication processes and, therefore, photonic integrated circuits.

A user-definable number of pairs of dielectric layers are simultaneously formed on both facets of the laser structure shown in FIG. 2 to a height below that of the active layer 13, where each pair of dielectric layers includes a first material 16 deposited first and a second material 17 deposited on the first material 16. Only one pair of dielectric layers is shown in FIG. 2, but any number of pairs of dielectric layers may be used.

Figure 3:
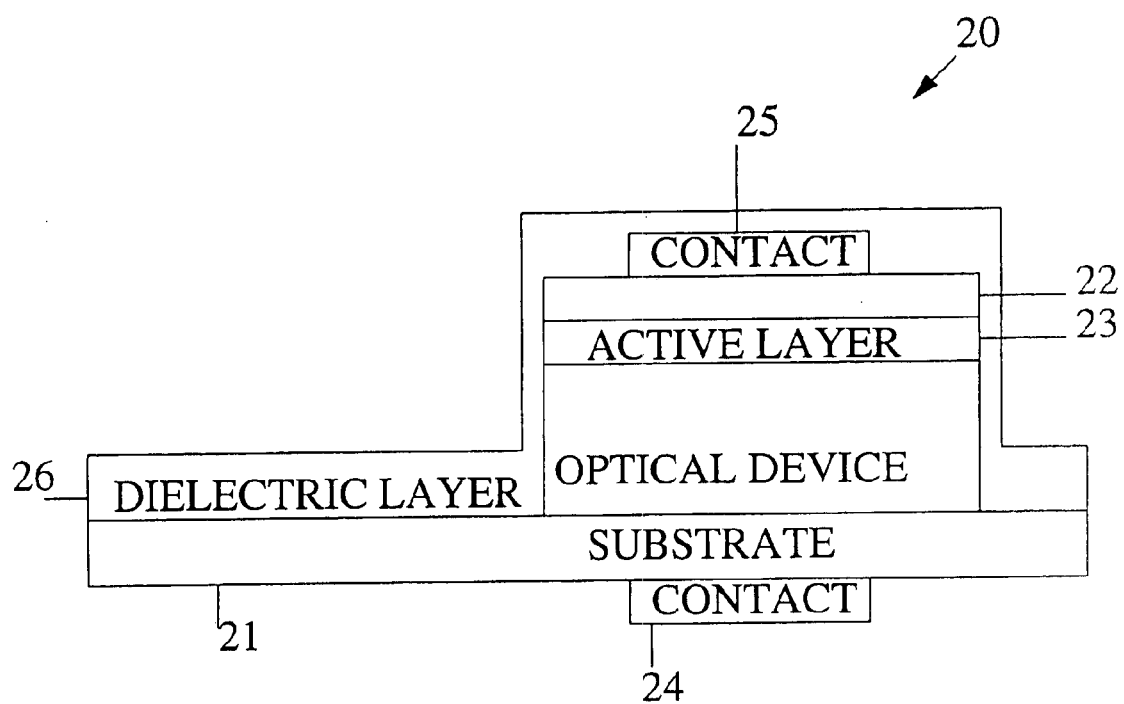
FIG. 3 is a cross-sectional view of an optical amplifier embodiment of the present invention.

FIG. 3 is a cross-sectional view of an optical amplifier 20 made by the method of the present invention. The optical amplifier 20 includes a substrate 21 of a material that is selected from the group of substrate materials that support optical activity. In the preferred embodiment, the group of substrate materials consists of sapphire, GaAs, GaSb, InAs, InP, InSb, and quartz. The substrate may be undoped, doped, doped n+, doped p+, or semi-insulating.

An optical device 22 is formed on the top-side of the substrate 21, where the optical device 22 includes an active layer 23 in which light emission is stimulated. The optical device 22 may be formed by any suitable method. The optical device 22 may be of any suitable structure (e.g., ridge, buried heterostructure, polygonal mesa, ring, Y-junction, etc.). In the preferred embodiment, the optical device 22 is a GaAs/AlGaAs ridge laser with a graded index separate confinement heterostructure (GRIN-SCH) double quantum well grown by MOCVD.

A backside contact 24 is formed on the bottom side of the substrate 21. In the preferred embodiment, the backside contact 24 is an n-type ohmic metal such as NiAuGeNiAu, but any other suitable contacting method may be used, including contacting methods where the contacts are all made from one side of the optical device 22. Optical pumping may also be used to pump the active layer of the optical device 22.

A top-side contact 25 is formed on the optical device 22. In the preferred embodiment, the top-side contact 25 is TiPtAu metal, but any other suitable contacting method may be used. The top-side contact 25 may extend past the boundary of the optical device 22 to more easily access the top-side contact 25 from a subsequent layer. A via (not shown) must be etched in subsequent layers deposited over the top-side contact 25 in order to access the top-side contact 25. Facets are then formed into each end of the optical device 22 to a user-definable depth into the substrate 21.

A user-definable number of dielectric layers are simultaneously formed on both facets of the optical amplifier 20 to a height below that of the active layer 23. If a single dielectric layer 26 (as depicted in FIG. 3) is formed on the facets, the index of refraction of the dielectric layer is less than the index of refraction of the optical device 22 then the thickness of the dielectric layer is $t=m\lambda/n4$, where m is an odd integer, where $\lambda$ is the free-space emission wavelength of the optical amplifier, and where n is the refractive index of the dielectric layer. When one dielectric layer is formed on the facets, it is preferred that the index of refraction of the dielectric layer be the square root of the index of refraction of the optical device.

What is claimed is:

1. A method of depositing a plurality of dielectric layers simultaneously on facets of an optical device in which light travels horizontally to increase facet reflectance, comprising the steps of:
   a) selecting a substrate;
   b) forming an optical device on the substrate, where the optical device includes at least one active layer in which photon emission is stimulated;
   c) forming an active-layer pump structure on the optical device;
   d) forming a plurality of facets in the optical device, where the plurality of facets include at least two different orientations; and
   e) coating the plurality of dielectric layers simultaneously onto the plurality of facets in at least two different orientations, where a first dielectric layer of the plurality of dielectric layers has a user-definable optical thickness, and where each successively coated dielectric layer of the plurality of dielectric layers is selected from the group of dielectric layers consisting of a dielectric layer with a higher index of refraction than a previously coated dielectric layer of the plurality of dielectric layers, and a dielectric layer with a lower index of refraction than the previously coated dielectric layer of the plurality of dielectric layers.

2. The method of claim 1, wherein the step of selecting a substrate is comprised of the step of selecting a substrate from the group of substrates consisting of sapphire, GaAs, GaSb, InAs, InP, InSb, and quartz.

3. The method of claim 1, wherein the step of selecting a substrate is comprised of the step of selecting a substrate from the group of substrates consisting of undoped substrate, doped substrate, doped n+ substrate, doped p+ substrate, and semi-insulating substrate.

4. The method of claim 1, wherein the step of forming an optical device of the substrate is comprised of the step of forming an optical device on the substrate selected from the group of optical devices consisting of a PN junction of direct gap semiconductors, a PIN structure with direct gap semiconductor quantum wells, a graded index structure with direct gap semiconductor quantum wells, and Er doped glass layers.

5. The method of claim 1, wherein the step of forming an optical device on the substrate is comprised of the step of forming an optical device in the form selected from the group of optical device forms consisting of a ridge, a buried heterostructure, a polygonal mesa, a ring, and a Y-structure.

6. The method of claim 1, wherein the step of forming an active-layer pump structure on the optical device is comprised of the step of forming an active-layer pump structure selected from the group of active-layer pump structures consisting of a physical contact and an optical window.

7. The method of claim 1, wherein the step of forming a plurality of facets in the optical device is comprised of etching facets in a method selected from the group of etching methods consisting of Inductively Coupled Plasma (ICP), Reactive Ion Etching (RIE), Chemically Assisted Ion Beam Etching (CAIBE), and anisotropic wet etching.

8. The method of claim 1, wherein the step of coating a user-definable number of dielectric layers simultaneously onto the plurality of facets in at least two different orientations is comprised of the step of coating a user-definable number of dielectric layers onto the plurality of facets in at least two different orientations in a method selected from the group of coating methods consisting of Plasma Enhanced Chemical Vapor Deposition (PECVD), plasma assisted sputtering, and thermal planetary evaporation.

9. The method of claim 1, wherein the step of coating the plurality of dielectric layers simultaneously onto the plurality of facets in at least two different orientations is comprised of coating a user-definable number of pairs of dielectric layers simultaneously onto the plurality of facets in at least two different orientations, where a first dielectric layer in each user-definable number of pairs of dielectric layers has a lower index of refraction than a second dielectric layer in each user-definable number of pairs of dielectric layers, and where the optical thickness of each first dielectric layer and each second dielectric layer in each user-definable number of pairs of dielectric layers is an odd integer multiple of quarter wavelengths.

* * * * *